United States Patent
Harder et al.

(10) Patent No.: US 7,724,516 B2
(45) Date of Patent: May 25, 2010

(54) COOLING ENCLOSURE FOR MAINTAINING COMMERCIAL-OFF-THE-SHELF (COTS) EQUIPMENT IN VEHICLES

(75) Inventors: Daniel Harder, Sammamish, WA (US); Charles F. Leonard, Maple Valley, WA (US)

(73) Assignee: The Boeing Company, Chicago, IL (US)

( * ) Notice: Subject to any disclaimer, the term of this patent is extended or adjusted under 35 U.S.C. 154(b) by 539 days.

(21) Appl. No.: 11/213,092

(22) Filed: Aug. 26, 2005

(65) Prior Publication Data

US 2007/0236881 A1    Oct. 11, 2007

(51) Int. Cl.
*H05K 7/20* (2006.01)
*H05K 5/00* (2006.01)
*A47G 19/08* (2006.01)
*A47B 81/00* (2006.01)

(52) U.S. Cl. ............... 361/679.51; 361/679.49; 361/724; 361/752; 361/695; 454/184; 312/223.1; 211/41.17

(58) Field of Classification Search .............. 361/689; 454/184
See application file for complete search history.

(56) References Cited

U.S. PATENT DOCUMENTS

| | | | | |
|---|---|---|---|---|
| 2,938,686 A * | 5/1960 | Lohstreter et al. | ......... | 244/118.1 |
| 3,120,166 A * | 2/1964 | Lyman | ......... | 454/307 |
| 4,089,040 A * | 5/1978 | Paulsen | ......... | 361/691 |
| 4,153,225 A * | 5/1979 | Paulsen | ......... | 244/118.1 |
| 4,535,386 A * | 8/1985 | Frey et al. | ......... | 361/714 |
| 4,616,694 A * | 10/1986 | Hsieh | ......... | 165/47 |
| 5,467,250 A * | 11/1995 | Howard et al. | ......... | 361/696 |
| 5,529,120 A * | 6/1996 | Howard et al. | ......... | 165/166 |
| 5,544,012 A * | 8/1996 | Koike | ......... | 361/695 |
| 5,570,740 A * | 11/1996 | Flores et al. | ......... | 165/104.34 |
| 5,717,572 A * | 2/1998 | Smith et al. | ......... | 361/695 |
| 5,832,988 A * | 11/1998 | Mistry et al. | ......... | 165/103 |
| 6,104,003 A * | 8/2000 | Jones | ......... | 219/400 |
| 6,119,768 A * | 9/2000 | Dreier et al. | ......... | 165/104.33 |
| 6,134,109 A * | 10/2000 | Muller et al. | ......... | 361/700 |
| 6,149,254 A * | 11/2000 | Bretschneider et al. | ......... | 312/223.1 |
| 6,164,369 A * | 12/2000 | Stoller | ......... | 165/104.33 |
| 6,330,152 B1 * | 12/2001 | Vos et al. | ......... | 361/688 |
| 6,400,567 B1 * | 6/2002 | McKeen et al. | ......... | 361/695 |
| 6,462,944 B1 * | 10/2002 | Lin | ......... | 361/687 |
| 6,494,050 B2 * | 12/2002 | Spinazzola et al. | ......... | 62/89 |
| 6,506,111 B2 * | 1/2003 | Sharp et al. | ......... | 454/184 |
| 6,535,382 B2 * | 3/2003 | Bishop et al. | ......... | 361/690 |
| 6,557,357 B2 * | 5/2003 | Spinazzola et al. | ......... | 62/89 |

(Continued)

*Primary Examiner*—Jayprakash N Gandhi
*Assistant Examiner*—Bradley H Thomas
(74) *Attorney, Agent, or Firm*—Harness, Dickey & Pierce, P.L.C.

(57) ABSTRACT

Apparatus and methods for thermal conditioning equipment. In a preferred embodiment, an equipment enclosure comprises a body, a wall, a fluid port, and a fixture. The body defines an outer plenum and an inner chamber in the latter of which the fixture retains the equipment. The wall, which is between the outer plenum and the inner chamber, isolates the thermally conditioned first fluid from a second fluid in the inner chamber. Since the wall is thermally conductive it allows heat to be transferred between the outer plenum and the inner chamber. The fluid port is in communication with the outer plenum to allow the thermally conditioned first fluid to flow into the outer plenum. Baffle plates are also provided to distribute flow of the second fluid to the equipment.

23 Claims, 7 Drawing Sheets

U.S. PATENT DOCUMENTS

| | | | |
|---|---|---|---|
| 6,574,970 B2 * | 6/2003 | Spinazzola et al. | 62/89 |
| 6,652,373 B2 * | 11/2003 | Sharp et al. | 454/184 |
| 6,704,198 B2 * | 3/2004 | Replogle et al. | 361/690 |
| 6,745,579 B2 * | 6/2004 | Spinazzola et al. | 62/89 |
| 6,776,707 B2 * | 8/2004 | Koplin | 454/184 |
| 6,819,563 B1 * | 11/2004 | Chu et al. | 361/696 |
| 6,843,306 B2 * | 1/2005 | Thompson | 165/80.3 |
| 6,877,551 B2 * | 4/2005 | Stoller | 165/47 |
| 6,889,752 B2 * | 5/2005 | Stoller | 165/47 |
| 7,011,576 B2 * | 3/2006 | Sharp et al. | 454/184 |
| 7,046,513 B2 * | 5/2006 | Nishiyama et al. | 361/695 |
| 7,074,123 B2 * | 7/2006 | Bettridge et al. | 454/184 |
| 7,209,351 B2 * | 4/2007 | Wei | 361/695 |
| 7,226,353 B2 * | 6/2007 | Bettridge et al. | 454/184 |
| 7,259,963 B2 * | 8/2007 | Germagian et al. | 361/695 |
| 7,403,391 B2 * | 7/2008 | Germagian et al. | 361/695 |
| 7,508,663 B2 * | 3/2009 | Coglitore | 361/695 |
| 2003/0002254 A1 * | 1/2003 | Faneuf et al. | 361/687 |
| 2004/0001313 A1 * | 1/2004 | Yoshikara | 361/687 |
| 2004/0180620 A1 * | 9/2004 | Sharp et al. | 454/184 |
| 2004/0190229 A1 * | 9/2004 | Caci et al. | 361/600 |
| 2005/0128689 A1 * | 6/2005 | Caci et al. | 361/679 |
| 2005/0225936 A1 * | 10/2005 | Day | 361/687 |
| 2005/0237714 A1 * | 10/2005 | Ebermann | 361/695 |

* cited by examiner

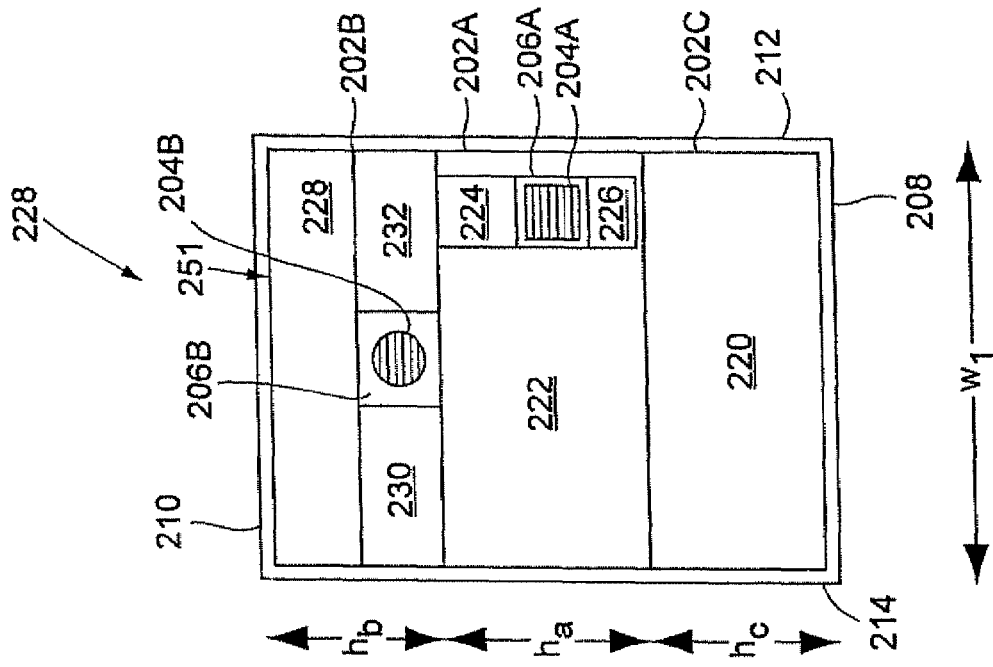
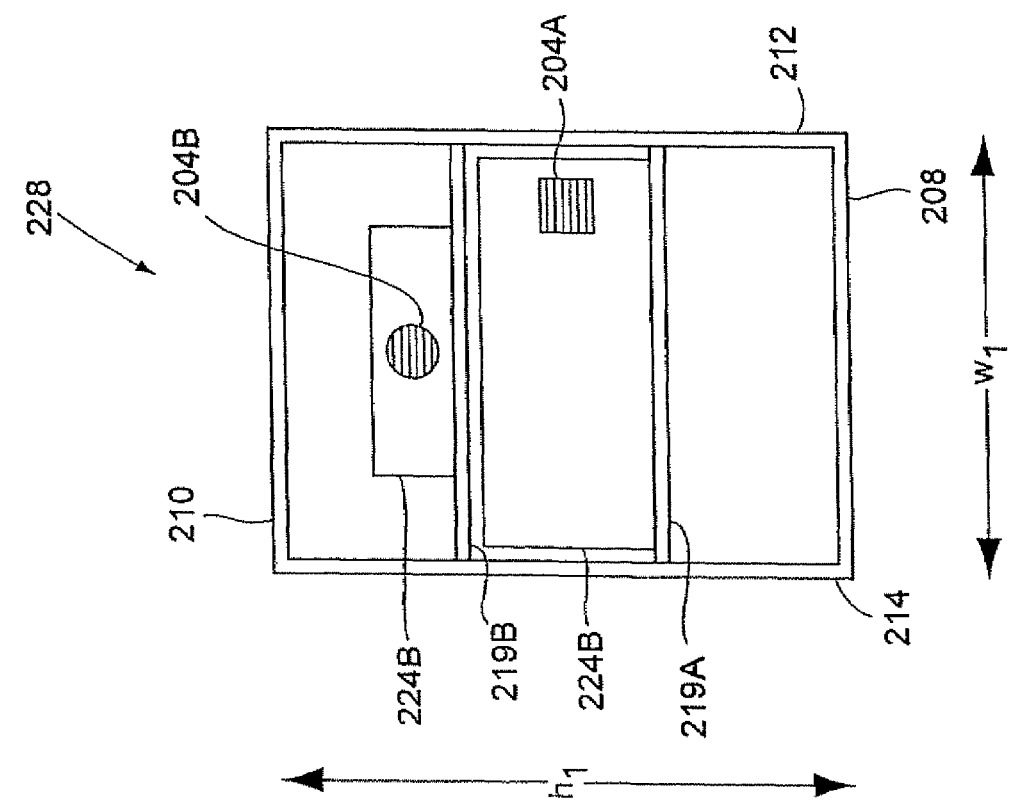
Figure 6B
Figure 6A

COOLING ENCLOSURE FOR MAINTAINING COMMERCIAL-OFF-THE-SHELF (COTS) EQUIPMENT IN VEHICLES

FIELD OF THE INVENTION

This invention relates generally to environmental control system and, more particularly, to environmental control systems for commercial-off-the-shelf (COTS) electronic equipment for use onboard mobile platforms such as aircraft.

BACKGROUND

Commercial-Off-the-Shelf (COTS) equipment is increasingly being used in military environments to take advantage of advancements in commercially available technology. By definition, COTS equipment has no or comparatively relaxed design environmental requirements. As a result, integration of the COTS equipment with systems designed to meet military specifications has proven to be difficult, especially for aircraft applications. A comprehensive solution to this integration challenge that accommodates all of the military operational requirements and FAA flight requirements has yet to be developed.

Such a solution would preferably allow for unforeseen variability in the COTS equipment and allow for quick, low cost integration of new equipment as it becomes available. Previously available attempts to solve these difficulties use unique equipment and are therefore expensive to modify even slightly. Without the unique equipment, however, it is difficult to efficiently provide the proper environment for the COTS equipment. Therefore the COTS equipment must be maintained in a mild environment while operating on military or even commercial aircraft. In addition to meeting the functional requirements for the equipment, the COTS equipment must also meet various requirements imposed by the relevant specifications for military applications and by the relevant Federal Aviation Administration (FAA) regulations for commercial applications. The various design requirements that the COTS equipment must meet include touch temperature, redundancy, smoke detection and clearing, fire suppression, thermal shock, vibration, electromagnetic interference, access, maintenance, redundancy. All of these requirements are preferably integrated into a comprehensive design approach that accommodates each potential piece of COTS equipment that might one day reside on the aircraft. However, the main parameters that are typically controlled are temperature and humidity.

Temperature control is typically accomplished by the aircraft environmental control system (ECS) which provides a source of air that has been conditioned to a pre-selected temperature. The cooling air is ducted to the various pieces of equipment or to the equipment cabinets or racks in which they are frequently located. From the equipment, or cabinets, the warmed exhaust air is then returned to the ECS system for re-cooling and recirculation. Because COTS equipment typically has very low limits on its air exhaust temperature COTS equipment is inefficient to cool. The low cooling efficiency in turn leads to very high cooling air flow demands (and therefore fan power consumption). The low temperature differential also makes transferring the heat off the plane very difficult. Additionally, changing the ducting configuration within a cabinet is costly and may involve changes to the configuration of the overall ECS system to accommodate even a single new piece of COTS equipment.

In addition to temperature control, humidity control can also be a challenge because many aircraft ground operations are conducted in humid environments with the cabin doors open. In such situations, elevated external ambient temperatures can limit cooling capacity while excessive humidity can cause moisture and condensation to be present in the aircraft. By way of contrast, in flight, the air is sometimes too dry for optimal performance of the COTS equipment. Unfortunately, a humidification system with the capacity to control the humidity for all of the equipment onboard a typical aircraft is prohibitively heavy.

SUMMARY OF THE INVENTION

It is in view of the above problems that the present invention was developed. In a first preferred embodiment, the present invention provides an equipment enclosure for use on an aircraft or other vehicle that has an Environmental Control System (ECS). The enclosure includes a body, a thermally conductive wall, a fluid port, and a fixture. The body defines an outer plenum and an inner chamber in which the equipment is mounted to the fixture. The fluid port is in communication with the outer plenum to allow a thermally conditioned first fluid to flow into the outer plenum. The thermally conductive wall, which is between the outer plenum and the inner chamber, prevents the thermally conditioned first fluid in the outer plenum from communicating with a second fluid in the inner chamber. Since the wall is thermally conductive, however, the wall allows heat to be readily transferred between the two fluids. The outer plenum may have a second port to collect the warmed first fluid for subsequent re-cooling and recirculation particularly by the aircraft ECS system. In the alternative, the outer plenum may allow the first fluid to flow out of the enclosure and into the aircraft cabin for eventual recirculation with the ambient air via aircraft cabin air returns.

A baffle that includes multiple baffle plates may also be provided with the current embodiment to distribute flow of the second fluid to the equipment in the enclosure. More specifically, the baffle plates are re-configurable so that they can fit around the front side of any piece of COTS equipment that is likely to be placed in the enclosure. Preferably, the baffle plates include segments of fabric, metal, or plastic with hook and loop fasteners (e.g., Velcro®) along the edges of each segment. To form a baffle plate for a particular piece of equipment, one or more fabric segments are attached to one another using the hook and loop fasteners to form a plate tailored for the particular piece of equipment. In particular, the baffle plate may be configured to include an aperture that will align with a cooling air intake of the piece of equipment when the baffle plate is attached to the shelf that holds the piece of equipment. The baffle plate may then be removably attached to that shelf. The baffle plate should preferably extend beyond the width of the piece of equipment such that the baffle plate will seal the gap between the equipment and the wall of the inner chamber. Additionally, the baffle plate should preferably extend slightly below the equipment to seal against the shelf. Likewise, the baffle plate should extend beyond the top of the equipment so as to seal against the shelf that is adjacent to the equipment's position in the enclosure. If the equipment is to be placed on the top shelf, then the baffle plate may seal against the top inside surface of the inner chamber. Additionally, the baffle plate may extend in any direction enough to create a lip that can be placed adjacent to the sealing surface for improved sealing performance. For shelves having no equipment, a baffle plate without an aperture can be fabricated to obstruct the flow of air through the resulting aperture at that particular location. Thus, the baffle plates create a seal between the equipment and the inner surfaces of the chamber such that a flow path exists through the equipment itself from the front of the inner chamber to the back of the inner chamber. Moreover, the baffle plates can be placed relative to the body of the enclosure and the equipment to form a plenum in the front of the inner chamber for mixing the re-circulated air before it enters the equipment. To recirculate the re-cooled air back to the equipment, the walls of the inner chamber may be hollow to form a return flow path or plenum there through. A fan may also be provided to aid the recirculation of the second fluid through the equipment.

In another preferred embodiment, the enclosure includes an inner chamber with an overall height. In this case the fixture(s) for mounting the equipment includes a plurality of shelves which are removably attachable to the body at predetermined heights within the inner chamber. Further, a collection of baffle segments is provided that allow the creation of baffles of many different sizes. Thus, particular baffles can be created so that for any shelf spacing within the inner chamber, a baffle can be created that extends from the shelf to which it is attached to the next shelf or to the top, inner surface of the inner chamber.

Further variations of the present invention are also possible. For instance, the thermally conditioned first fluid can be air that is ducted to the enclosure from the thermal conditioning system and the second fluid can be air also. Additionally, a pair of valves can be included in the enclosure in a position to cause air from the ECS system to circulate through the inner chamber and then return to the aircraft ECS system. It is also preferred that the equipment enclosure of the current embodiment include an access door on the front side of the body and another door on the back side. Additionally, a seal between the door(s) and the body may form a hermetic and pressure tight seal between the inner chamber and the door when the door(s) are closed.

Other alternative embodiments of the enclosures provided herein include active temperature control loops. For instance, a temperature controller may sense the temperature of the second fluid in the inner chamber and adjust the flow of the first fluid in response thereto. In the alternative, a thermoelectric cold plate may be placed at the upstream side of die outer plenum with the temperature controller operating the cold plate in response to the temperature of the second fluid. The humidity in the inner chamber may also be controlled by, for instance, placing a water vapor source in communication with the inner chamber or by operating the pair of valves that allow ECS fluid to circulate in the inner chamber.

In another preferred form, the present invention provides a method of thermally conditioning equipment in an environment where a thermal conditioning system supplies a thermally conditioned first fluid. Generally, the method of the current form includes isolating the equipment from the thermally conditioned first fluid and then using the thermally conditioned first fluid to indirectly exchange heat with the equipment. More particularly, the method includes exchanging heat between the equipment and a second fluid in the inner chamber of the equipment enclosure. The heat is also exchanged between the first fluid and the thermally conditioned second fluid (which is flowing in an outer plenum of the equipment enclosure). The isolation of the equipment from the thermally conditioned second fluid may include using a thermally conductive wall between the inner chamber and the outer plenum.

Both fluids can be air and, more particularly, air from the ECS system of an aircraft. In cases where the fluid in the inner chamber is air, the method may also include humidifying that air. Further, depending on operating conditions (e.g., the temperature of the fluid exiting the inner chamber), the method may include allowing the thermally conditioned first fluid to flow through the inner chamber. In the alternative, or in addition, the method may include adjusting the flow of the thermally conditioned first fluid through the outer plenum.

A baffle may also be constructed in the inner chamber to form an inlet plenum for mixing the second fluid before it flows through the equipment. The baffle of the current embodiment includes several baffle plates that are preferably assembled from a collection of segments of fabric, plastic, or metal. The baffles may be removably attached to the shelves, the equipment or even the inner surfaces of the inner enclosure. Additionally, the baffles can be located in such a manner that the second fluid is forced to flow through the equipment.

Another preferred embodiment of the present invention provides an equipment enclosure that allows complete humidity and temperature control of COTS equipment. The enclosures of the current embodiment use existing aircraft (or other vehicle) ECS systems to remove heat from the enclosure. Moreover, the enclosures of the current embodiment distribute cooling air to the individual pieces of equipment rather than relying on the ECS systems for this function. Additionally, the enclosures of the current embodiment isolate the equipment mounted therein from harsh conditions that are likely to be encountered on the vehicle. The enclosures also isolate the equipment from direct contact with the cooling air in the ECS systems. Moreover, the current embodiment also provides redundant cooling capacity that is independent of the vehicle ECS system. These enclosures are easy to reconfigure for, inter alia, changing the mixture of equipment within the enclosure.

The present invention provides several other advantages over previous approaches. First, because the equipment is in a contained space, only minimal amounts of water can be used to maintain humidity levels in the cooling air for the equipment. Second, the equipment that controls the flow of cooling air to the COTS equipment is isolated from the ECS flow path. Thus the flow of coolant is independent of the ECS system flow rate. More particularly, the cooling air can be isolated from the ECS flow by a wall of the enclosure. This wall can also serve as a heat exchanger between the cooling air and the air in the ECS system. Because the wall isolates the COTS equipment from the ECS system, individual pieces of COTS equipment may have as much cooling air flow as the draw of the equipment's built-in fan can provide. As a result of the unique configuration of the enclosures provided herein, the ECS system is only used to remove heat from the COTS equipment. This practice is in contrast to the previous approaches of using the ECS system to both remove heat from the equipment and to provide flow control of the cooling air to the specific pieces of equipment.

In another preferred embodiment, a baffle is created near the front of the enclosure and just upstream of the equipment in the enclosure. The baffles are positioned to direct the cooling air into the equipment from which the warmed air is discharged toward the rear of the enclosure. Thus, the enclosure contains a mixing plenum upstream from the equipment and a discharge plenum downstream from the equipment and that is formed between the equipment and the rear wall of the enclosure. Return plenums in the hollow side walls of the inner chamber complete a circuit for the cooling air to circulate between the mixing plenum and the exhaust plenum of the inner chamber. Fans, which may be provided with the enclosure, draw air from the exhaust plenum and cause it to flow to the mixing plenum thereby creating a one-way flow path within the enclosure. The circulating air flows through the equipment from the mixing plenum to the exhaust plenum and thence through the return plenums to return to the mixing plenum. These plenums, particularly the exhaust plenum, reduce the pressure drop associated with the cooling air flowing along the circulation path. The resulting minimal pressure drop in turn allows the low power fans that may be provided with the pieces of equipment to supply the motive force to move the cooling air instead of relying on the fans or other equipment of the aircraft ECS. By creating the baffle in the manner described herein, the enclosure is easy to reconfigure for changing the mix of equipment therein by way of modifying the baffle. This is a much simpler solution than reconfiguring the typical ducted plenums found in previously available avionics cabinets or racks. The configuration of the current embodiment also makes it possible to have a single temperature control point, preferably in the mixing plenum, for the cooling air circulating within the enclosure. Accordingly, the current embodiment provides accurate temperature control of the cabinet and parallel flow of cooling air to each piece of equipment within the enclosure.

Further features and advantages of the present invention, as well as the structure and operation of various embodiments of the present invention, are described in detail below with reference to the accompanying drawings.

BRIEF DESCRIPTION OF THE DRAWINGS

The accompanying drawings, which are incorporated in and form a part of the specification, illustrate exemplary embodiments of the present invention and together with the description, serve to explain the principles of the invention. In the drawings:

FIG. 6A illustrates an inner chamber in accordance with one embodiment of the invention; and FIG. 6B illustrates baffle plates and baffles of the inner chamber shown in FIG. 6A.

DETAILED DESCRIPTION OF THE PREFERRED EMBODIMENTS

Figure 1:
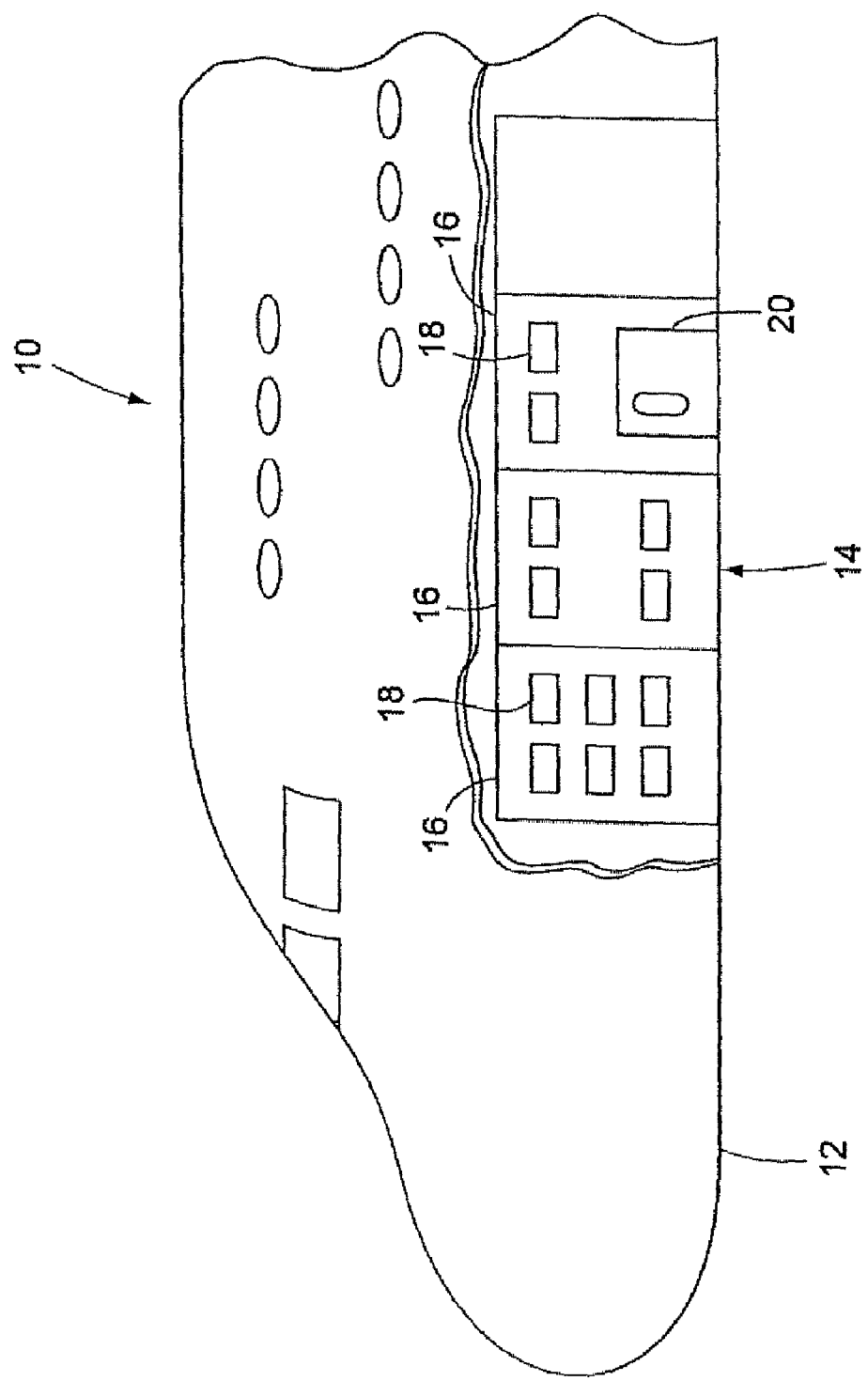
FIG. 1 illustrates a vehicle that is constructed in accordance with the principles of the present invention.

Referring to the accompanying drawings in which like reference numbers indicate like elements, FIG. 1 illustrates an exemplary aircraft that is constructed in accordance with the principles of the present invention.

More particularly, FIG. 1 shows a model 747 commercial aircraft 10 that is available from The Boeing Company of Chicago, Ill. The aircraft 10 is exemplary and could be any aircraft either civilian, military, or otherwise. FIG. 1 also shows a lower lobe 12 of the aircraft 10, an avionics bay 14, several electronic equipment racks 16, numerous pieces of electrical equipment 18, and an equipment enclosure 20 of the present invention. The lower lobe 12 includes the avionics bay 14 in a convenient location near the crew cabin so that the crew can access the electrical equipment 18 that resides in the avionics bay. The avionics bay 14 is maintained at a pre-selected temperature by an environmental control system (ECS) of the aircraft 10. The ECS system supplies fresh air at a pre-selected temperature and a flow rate deemed suitable for ventilating and cooling (i.e. thermal conditioning) the avionics bay 14 and the objects present therein.

Figure 2:
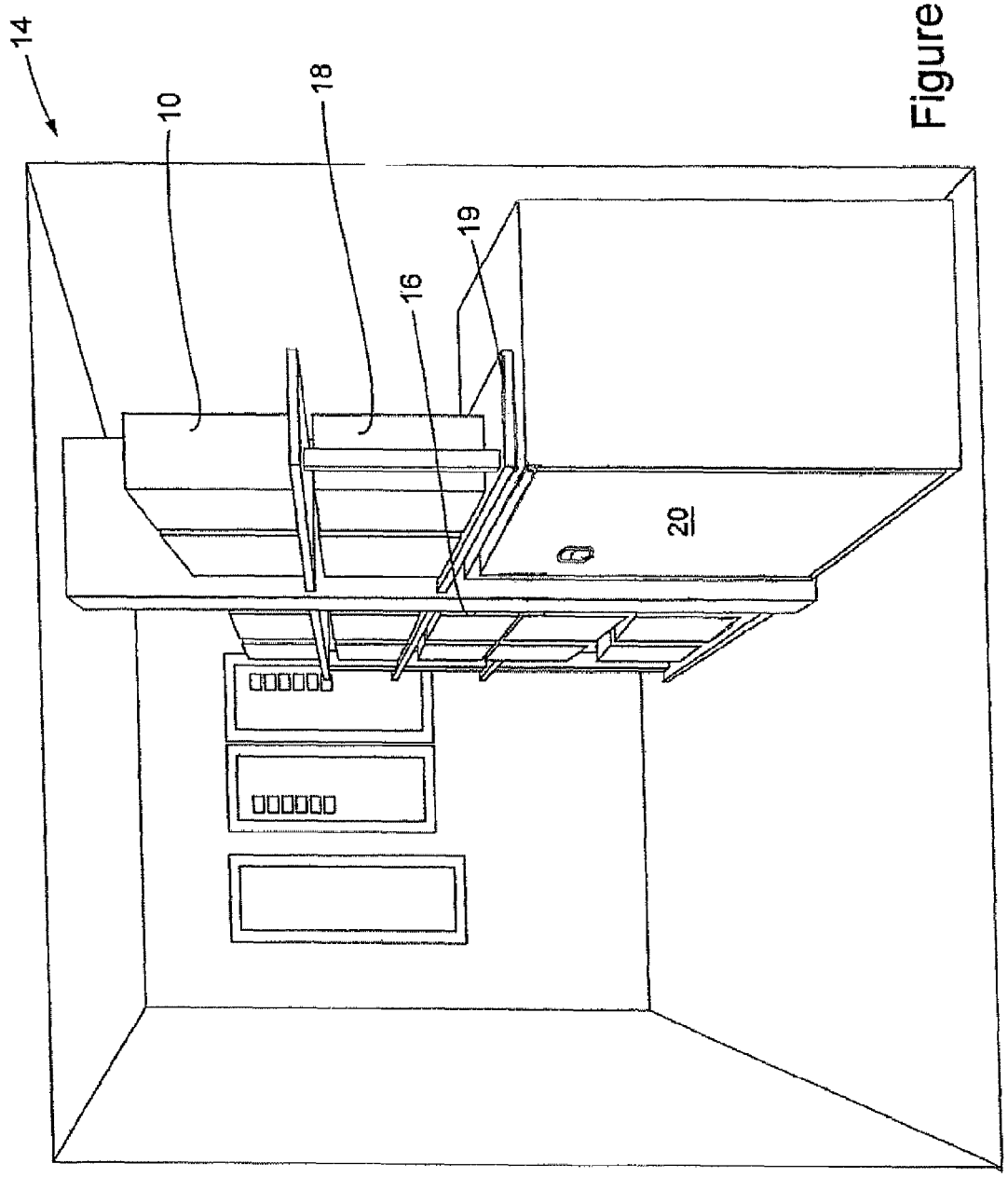
FIG. 2 illustrates an avionics bay of the vehicle of FIG. 1.

More specifically, and referring to the aviation bay 14 shown in FIG. 2, the ECS system typically includes ducting installed behind and throughout the equipment racks 16. The ducting is usually unique for any given avionics bay 14, equipment rack 16, and even for any given equipment shelf 19 and piece of equipment 18. Since the avionics bay 14, the ECS system, and the equipment 18 are desired in view of each other, orifices are installed in the ducting to ensure that the proper amount of air flow is distributed to each piece of equipment 18. This design approach allows the ECS system to be optimized for efficient operation. However, because the orifices and ducting are behind and within the equipment racks 16, they are difficult to access and costly to alter. Moreover, because some of the flow paths through the ducts are not parallel, heat from one piece of equipment 18 may impact the cooling of another piece of equipment 18.

Once the ECS system distributes the air to the pieces of equipment 18, internal fan(s) of the pieces of equipment 18 (when provided by the equipment vendor) draw the air into the equipment 18 to cool its component parts. These internal fans cause the warmed air to exhaust to the avionics bay 14 where return ducts gather the warmed air for cooling, filtration, and recirculation. Accordingly, die pieces of equipment 18 are typically designed to operate at, and about, the pre-selected temperature of the avionics bay 14. Additionally, the pieces of equipment 18 are designed to operate with the range of humidity that typically occurs in the avionics bay 14. Humidity is typically not controlled by the ECS system, although most ECS systems do remove moisture via condensation when the air is cooled. Just removing the moisture however is not sufficient because many types of equipment 18 can be affected by excessively dry air.

Nonetheless, because of weight limitations onboard the typical aircraft 10, humidification is usually only provided for the air that will be distributed to the crew cabin. That being said, the avionics bay 14 that is illustrated in FIGS. 1 and 2 is a rather benign environment because it is a bay on a commercial 747 aircraft 10. However, the avionics bays on other aircraft and vehicles may present a wider range of temperatures and humidity (as well as other environmental conditions) than the avionics bay 14 of FIGS. 1 and 2.

In flight, the ambient environment of die avionics bay 14 provides a large heat sink in which the equipment 18 dumps heat via the cooling air. Often the ECS system and equipment 18 are scaled to allow full operation of all of the equipment 18 in flight and some limited operation of the equipment when ambient, external temperatures limit the available cooling capacity. Ground operations on hot days are a typical example of a situation in which ambient, external temperatures might limit the available cooling capacity, unless ground cooling carts are available. For "bare base" operations, ground cooling carts may not be available at all and equipment 18 operations are sometimes limited accordingly.

The aviation industry has begun placing commercial-off-the-shelf (COTS) equipment onboard vehicles such as the aircraft 10. These pieces of COTS equipment, however, were not necessarily designed for the environment of the avionics bay 14. Thus, to accommodate the COTS equipment it sometimes becomes necessary to reconfigure the avionics bay or the ECS system of the aircraft. However, given the unique equipment involved (e.g., the ducting) such reconfigurations are typically costly. Furthermore, COTS equipment is typically not designed to operate in the relatively arid environment that might be present in the avionics bay from time to time. Additionally, when the aircraft is on the ground the operation of the COTS equipment may also be constrained due to excessive humidity (depending on the geographic location of the aircraft) or by the limited cooling capacity sometimes available on the ground. Thus, the COTS equipment, and for that matter many other pieces of avionics equipment, are dependent on the mechanical systems of the aircraft. Also, the COTS equipment in the avionics bay is exposed directly to ECS system pressure and the dust or other particulate matter that might be entrained therein. Since the ECS system pressure (i.e., cabin pressure) can change, it may not be desirable to expose the COTS equipment to such change if the COTS equipment has not been designed for changing ambient pressure.

Figure 3A:
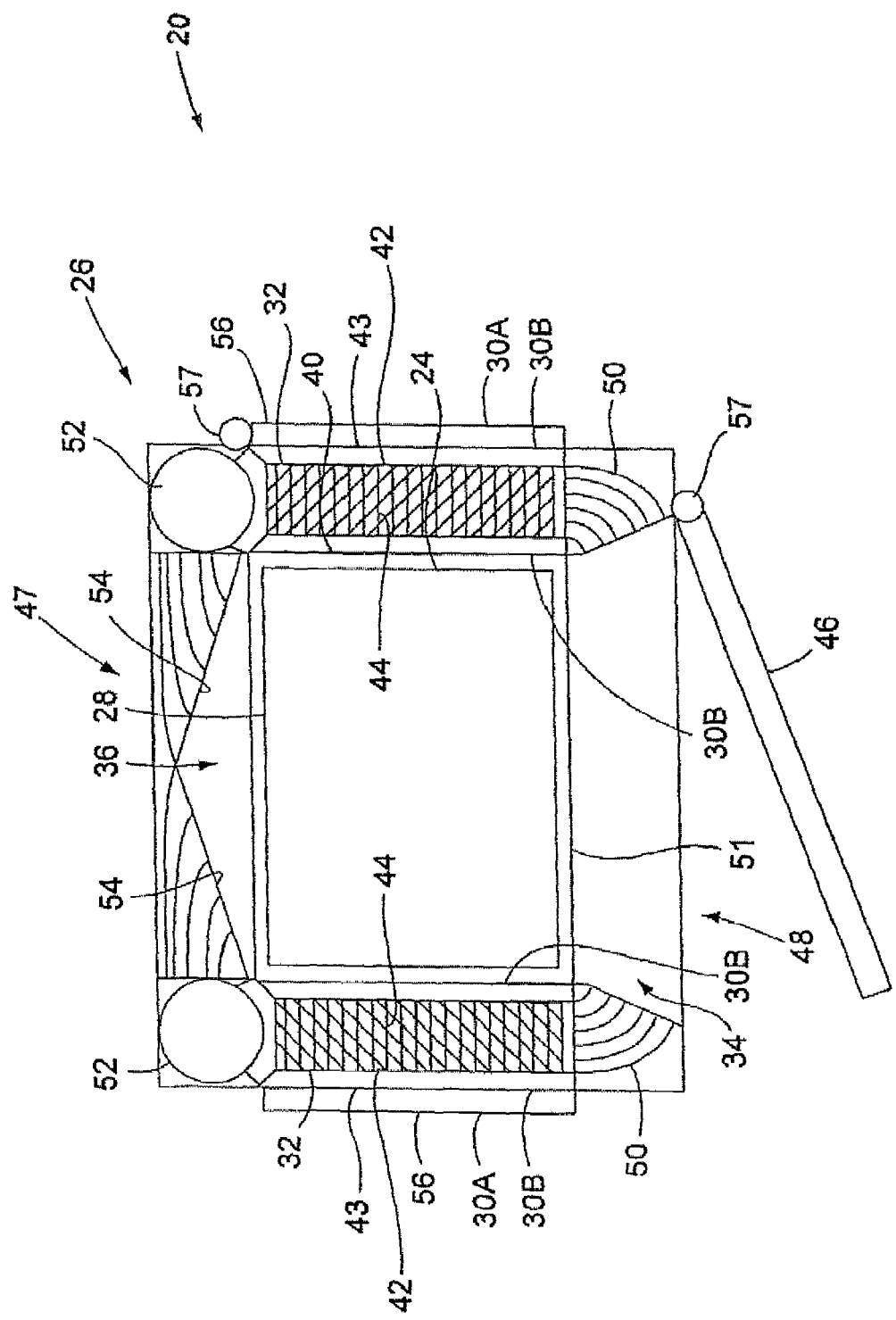
FIGS. 3A-3D illustrate embodiments of the equipment enclosure of FIG. 2 constructed in accordance with the principles of the present invention.
Figure 3D:
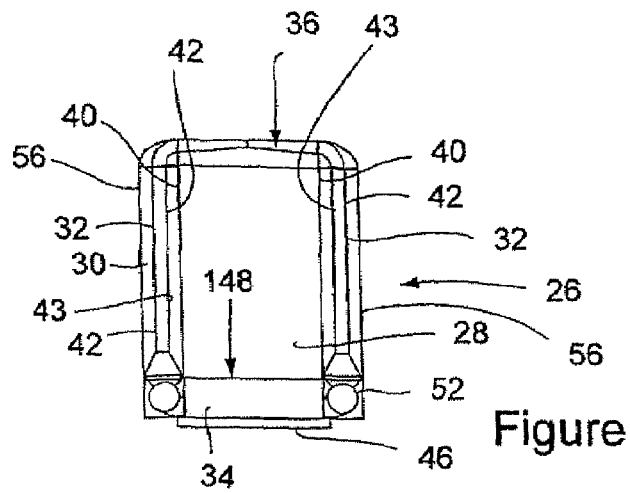
Figure 3B:
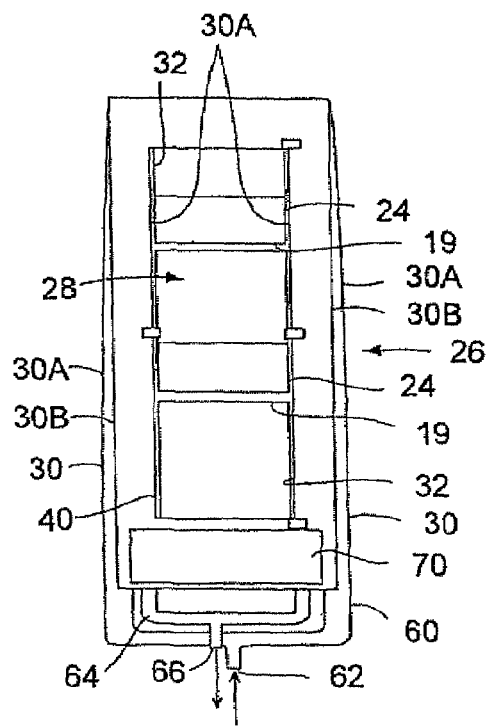
Figure 3C:
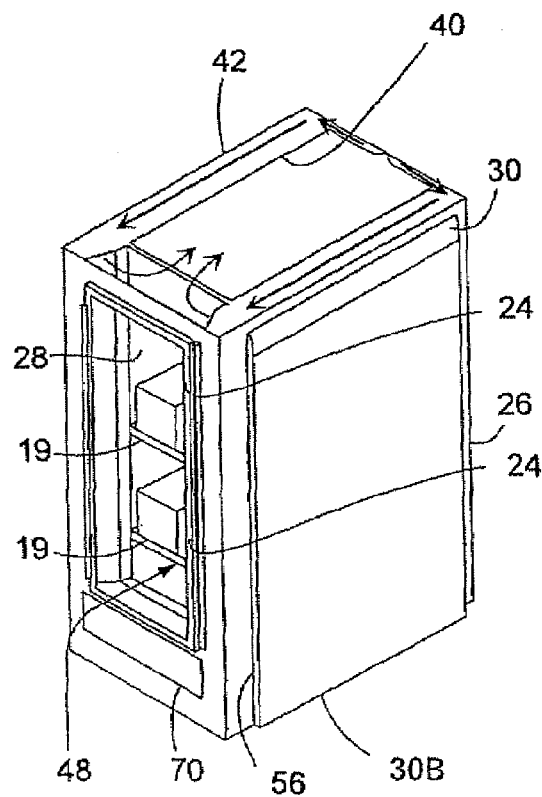

Turning now to FIG. 3A, an enclosure 20 of a preferred embodiment of the present invention is shown. The enclosure 20 contains various pieces of COTS equipment 24. Preferably, a body 26 is constructed of a sheet metal such as aluminum and includes a number of channels, ducts, vessels, or other structures. These structures define an inner chamber 28, an outer plenum 30, and a pair of return plenums 32 among other things. Also shown are a mixing plenum 34 and an exhaust plenum 36. As illustrated in FIG. 3A, the structures of the enclosure 20 include an inner vessel 40, a pair of return ducts 42, a wall 43 of the return ducts 42 with optional heat exchange surfaces 44 (e.g., fins), a front door 46, a door frame or door way 48, a pair of elbows or turning vanes 50, a baffle 51, a pair of (Preferentially tangential) recirculation fans 52, a pair of return guide vanes 54, and a pair of ECS air channels 56. Further, FIG. 3B shows the ports and ducting for the ECS supply and return. The ECS subassembly includes an ECS supply duct 60, an ECS supply port 62, an ECS return duct 64, and an ECS return port 66. Also, FIG. 3B shows a thermoelectric cold plate 70 of a preferred embodiment of the present invention.

Together these components define two flow paths in particular. The first flow path is for the ECS cooling air and the second flow path is an internal recirculation path for the cooling air that is in direct contact with the COTS (or other) equipment 24. The thermally conductive wall 43 and heat fins 44 allow the two fluids to exchange heat so that the enclosure 20 thermally conditions the COTS equipment 24 in the inner chamber 28. More particularly and starting with the internal recirculation path, FIG. 3A shows that the air in the exhaust plenum 36 of the inner chamber 28 (or "internal air") flows into the fans 52 and then through the return ducts 42 that are along either side of the inner chamber 28. Within the return ducts 42, the internal air transfers heat to the heat exchange surfaces 43 and 44. From the return ducts 42, the internal air then flows through the low pressure drop turning vanes 50 and thence into the door way 48 wherein the streams of air exiting the two vanes 50 mix. The doorway 48, or large mixing plenum 34, is defined by the door 46 and the baffle 51 which is placed just upstream of the equipment 24. As the internal air enters the mixing plenum 34 it slows down and recovers pressure from this change in speed. The internal air also mixes in the mixing plenum 34 so that it assumes a generally isothermal condition before exiting the mixing plenum 34 to the inner chamber 28.

Continuing along the recirculation path, the baffle 51 has one or more apertures that are aligned with the cooling air intakes of the various pieces of equipment 24. Otherwise, the baffle 51 seals against the walls 43 and the topmost inner surface and the bottommost surface of the inner chamber 28. Meanwhile, the shelves 19 generally support the baffle 51 and assist it in resisting the pressure differential that develops across the baffle 51 as a result of the air flowing through it. Further, the baffle 51 directs the mixed internal air to the cooling air intakes of the equipment 24. If the pieces of equipment 24 include internal fans, these fans draw the internal air into the pieces of equipment 24. Thus, depending on how these fans are controlled by the pieces of equipment 24 or otherwise, the internal fan of any particular piece of equipment 24 largely determines the flow rate of the cooling air through that piece of equipment 24. Otherwise, the motive force supplied by the fans 52 drives the recirculation of the internal air through the equipment 24. As the internal air flows through the equipment 24 it absorbs heat from the internal components of the equipment 24 and is discharged from the equipment 24 into the exhaust plenum 36. As shown in FIG. 3A, the exhaust plenum 36 is formed by the downstream (or rear face) of the equipment 24 and the entrance to the guide vanes 54 which preferably forms an oblique angle with the rear surface of the equipment 24. Again, because of the decrease in velocity of the internal air as it enters the exhaust plenum 36, the internal air recovers pressure. As in the mixing plenum 34, mixing of the internal air again occurs in the exhaust plenum 36. From the exhaust plenum 36, the air flows into the guide vanes 54 which are configured to guide the air into the fans 52 in a direction and at a speed that is optimal for the fans 52. In this manner, the pressure loss (and energy required to compensate for it) associated with the recirculation of the internal air is minimized. Thus, in general, the internal air flows from the fans 52 through a heat exchanger in the return plenums 32 where it is cooled (or warmed if desired). The cool internal air then flows into the mixing plenum 34 and thence to the equipment 24. Once in the equipment 24, the internal air cools the equipment 24 and returns to the fans 52 via the exhaust plenum 36.

On the other side of the heat exchangers formed by the return plenums 32, the thermally conductive wall 43, and preferably the heat transfer fins 44, the ECS air absorbs heat, which originated in the equipment 24, from the heat exchange surfaces 43 and 44. The ECS air enters the outer plenum 30 (which forms the other side of the heat exchanger) from the ECS supply port 62 via the ECS supply duct 60. Once through the heat exchanger, the warmed ECS air then exits the enclosure 20 via the ECS return duct 64 and ECS return port 66. As best seen in FIG. 3B, a preferred embodiment of the enclosure 20 is constructed such that the outer plenum 30 is formed in two portions 30A and 30B. Cool ECS air flows in an upwardly direction past the thermoelectric cold plate 70 (or optionally a heater if warming of the equipment 24 is preferred) and into the riser section 30A of the outer plenum 30 and flows up alongside the side of the enclosure 20. The thermo-electric cold plate 70 can be used if it is desired to supply the outer plenum 30 with cooler air than otherwise provided by the ECS system. The cool ECS air reaches the topmost portion of the riser 30A and turns back to flow through the downcomer portions 30B of the outer plenum 30. In the downcomers 30B the ECS air encounters the heat exchange surface or wall 43 and absorbs the heat that originated with the equipment 24. From the downcomers 30B, the now warm ECS air exits the enclosure 20 via the return port 66 for reconditioning in the ECS system of the aircraft 10 (see FIG. 1). Of course, such terms as "up" "down," are used herein for convenience and do not imply that the enclosure 20 must be placed in the avionics bay 14 in any given orientation although the vertical orientation implied herein is preferred.

FIG. 3A also shows a rear door 47 connected to the body of the enclosure 20 by a hinge 57. The door 47 includes the fans 52 (and the structure support the fans) and the guide vanes 54 rigidly connected to each other to form a sturdy structure. Thus the hinge allows the door 47, including the fans 52 and the guide vanes 54, to pivot away from the enclosure. This pivoting action allows access to the interior chamber 28 and the rear of the equipment 24 therein. A latch or handle can secure the door 47 to the body of the enclosure at any suitable location such as on the outer shell or plenum 30 on the side of the enclosure opposite the hinge 57.

Figure 4:
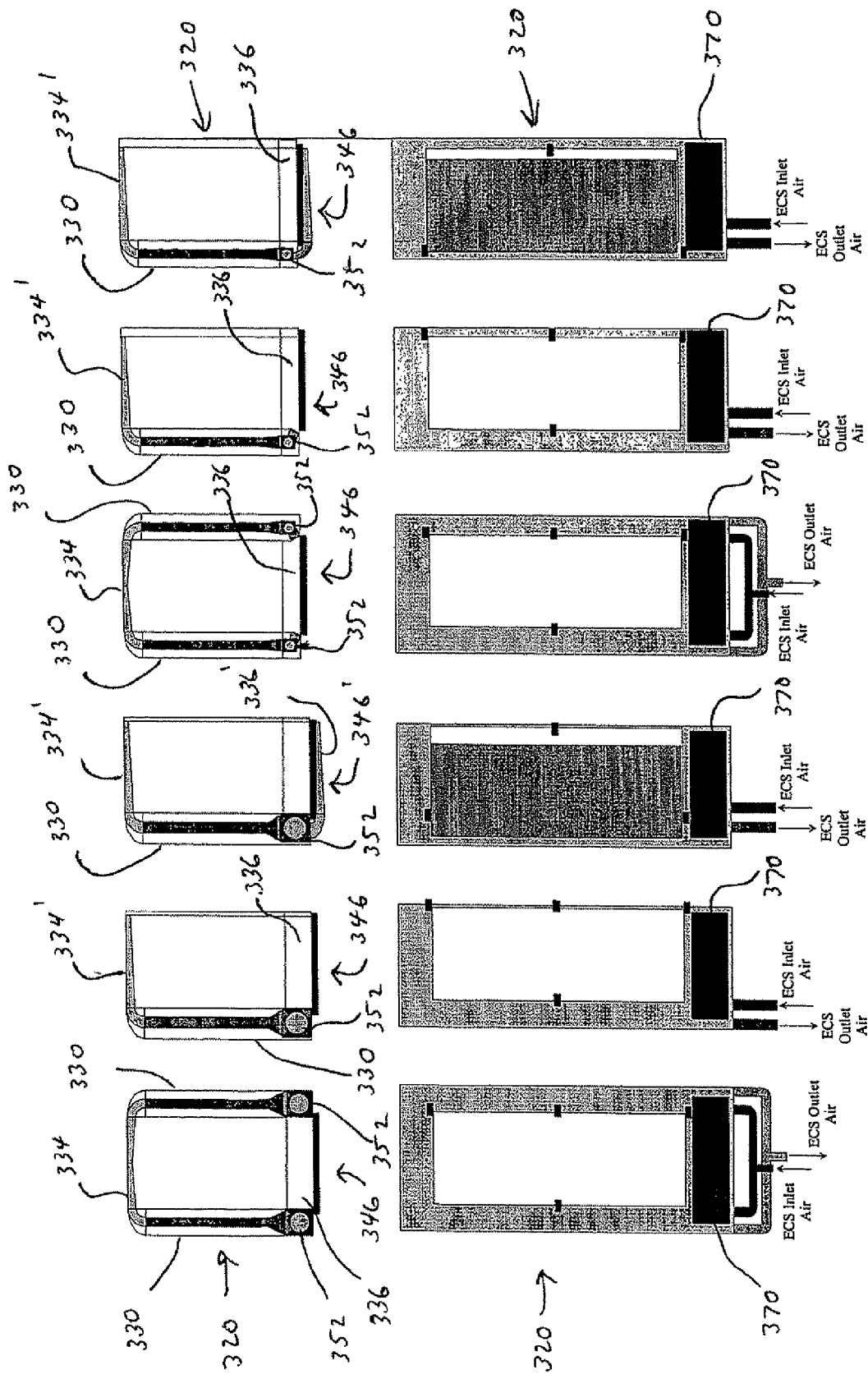
FIG. 4 illustrates various embodiments of equipment enclosures.

FIG. 4 shows several pairs of plan and elevation views of yet other preferred embodiments of the present invention. More particularly, FIG. 4 illustrates six of the many possible variations of how air from the ECS system may be used to cool an enclosure. From left to right, the first pair of views of FIG. 4 shows ECS air being supplied to a heat exchanger of an active cooling device 370 with the ECS air being exhausted out of the bottom of the enclosure 320 and back to the ECS system. The active device 370 thus cools the internal air (that is circulating through the enclosure 320) while keeping the two air streams separated. From the active cooling device 370, the cooled internal air flows to the air plenum 336 in front of the COTS electronics (not shown). The COTS fans draw the internal air into the COTS equipment and exhaust the air to the plenum 334 in the back side of the enclosure 320. The enclosures tangential fans 352 pull this air back to the front plenum 336 via the active cooling device 370.

Regarding the second pair of views of FIG. 4, the embodiment shown therein is similar to the embodiment of the first pair of views except that in the first column (or pair of views) the tangential fans 352 are located on both sides of the enclosure 320. In the second column there is only one tangential fan 352 on one side of the enclosure 320 and the rear plenum 334' is modified to collect the warmed internal air from across the width of the enclosure 320. The fan 352 is used to distribute the internal air from the cooling device 370 evenly over the face of the COTS equipment. From the front plenum 336 the COTS internal fans then pull the internal air into the COTS equipment thereby cooling the electronics and other devices in these packages. The third column of views is also similar to the first column except that the plenum 336' that is used to collect the cooled internal air from the active cooling device 370 is located in the door 346 and not built into the main body of the enclosure 320. Columns 4 through 6 illustrate ECS air being brought in and blown across the heat exchangers located in the side plenum(s) 330 of the enclosure 320. Heat is then exchanged with the internal air that is inside the enclosure 320 via these heat exchangers. Again the two air sources are kept separated. In all of the embodiments of FIG. 4 the bottom active heat exchange components 370 also provide humidity control in addition to thermally conditioning the internal air.

Figure 5:
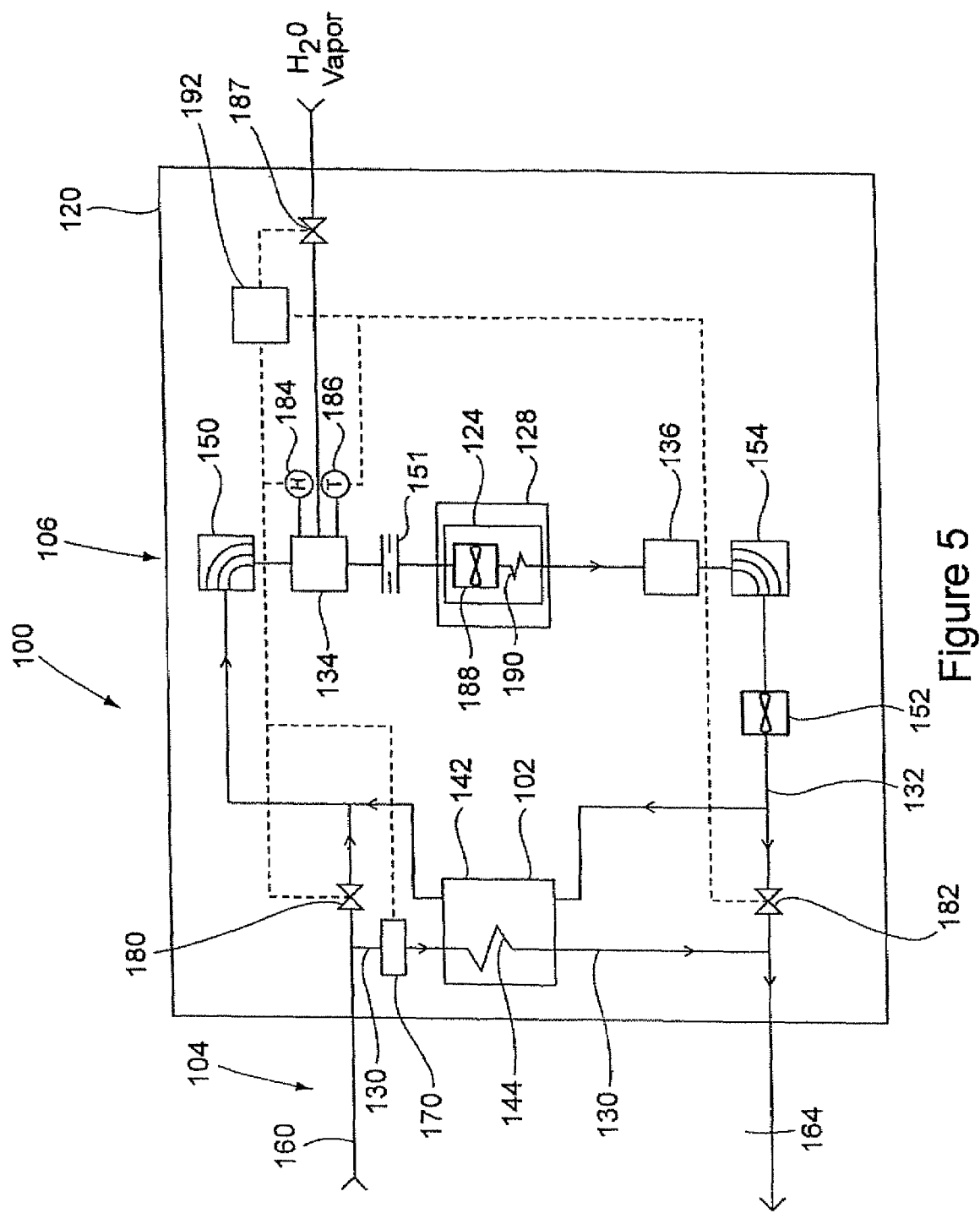
FIG. 5 schematically illustrates an environmental control system in accordance with one embodiment of the invention.

Referring now to FIG. 5, a cooling system that is constructed in accordance with another preferred embodiment of the present invention is shown schematically. The system 100 includes a heat exchanger 102, a branch of the ECS system 104 of an aircraft 10 (see FIG. 1) and a cooling air recirculation loop 106. The two systems 104 and 106 interact in the heat exchanger 102 to remove (or add) heat to the recirculation loop 106 so that the system 100 thermally conditions the equipment in the enclosure 120. In addition to the components that correspond to the structures and plenums of the enclosure 20 of FIG. 3, the system of the current embodiment also includes a pair of mixing valves 180 and 182, a humidity sensor 184, a temperature sensor 186 (e.g., a thermocouple), a water vapor supply valve 187, a fan 188 that is internal to a piece of COTS equipment 124 and internal components 190 of a piece of COTS equipment 124 in the inner chamber 128. FIG. 5 also shows a controller 192 for coordinating various operations of the system 100.

Preferably, the system 120 allows for closed loop humidity control of the internal air that circulates within the loop 106. More particularly, the humidity sensor 184 is located in the mixing plenum 134 and the pair of mixing valves 180 and 182 are plumbed between the outer plenum 130 and (indirectly) the inner chamber 128. Moreover, the mixing valves 180 and 182 are located such that when the valves 180 and 182 open, ECS air from the outer plenum 130 flows through the ECS supply mixing valve 180 and into the recirculation loop 106 where it joins the internal air in recirculating through the recirculation loop 106. Some air from the recirculation loop 106 then exits through the ECS return mixing valve 182. The valves 180 and 182 are opened by the controller 192 when the controller determines from the humidity sensor 184 that it is desirable to adjust the humidity in the inner chamber 128. Thus, by introducing ECS air into the inner chamber 128, opening the valves 180 and 182 allows the inner chamber 128 humidity to be regulated. In addition, the valves 180 and 182 may be opened in response to the temperature sensed by the temperature sensor 186 to provide closed loop temperature control of the inner chamber 128 and the equipment 124 therein. The cold plate 170 may also be turned on by the controller 192 in response to the temperature of the air in the mixing plenum 134. While the cold plate 170 is shown as being in the ECS branch 104, it could instead be located in the return plenums 132 of the internal air loop 106. With the cold plate 170 in the recirculation loop 106, the enclosure 120 provides additional cooling capacity above that offered by the ECS system and independently thereof. Accordingly, the enclosure 120 provides redundant cooling capacity for the equipment 124.

In another preferred embodiment that is also shown in FIG. 5, the humidity sensor 184 is located in the mixing plenum 134 with the water vapor supply valve 187 being plumbed between a source of water vapor and the front mixing plenum 134.

In the current embodiment, the controller 192 communicates with the humidity sensor 184 to sense whether the air in the mixing plenum 134 is at a desirable humidity level. The controller 192 also communicates with the water vapor supply valve 187 to open and close it in response to the humidity of the cooling air. Thus, the controller 192 or "cabinet control system" controls the humidity of the air in the inner chamber 128.

With reference now to FIG. 6, the inner chamber 228 of a preferred embodiment of the present invention is shown with equipment 224 installed in it in FIG. 6A and with a baffle 251 in place in FIG. 63. FIGS. 6A and 63 are elevation views of the inner chamber 228 (with the door and other structures of the enclosure not shown). More particularly, FIG. 6A shows that each of the pieces of equipment 224 in the inner chamber 228 preferably rests on and is mounted to one of the shelves 219. While the inner chamber 228 has an overall height "h," each of the shelves 219A and 2193 (and the bottom of die chamber also) has a predetermined height "ha" and "$h_b$," (and "$h_c$") at which it has been attached to the enclosure. The inner chamber 228 also has an overall width "w." The baffle 251 fills the overall height "h" and width "w" of the inner chamber 228. Further, the baffle 251 includes several baffle plates 202 that are associated with and removably attach to each of the shelves 219. Where the particular pieces of equipment 224A and 224B have cooling air inlets 204A and 204B the baffle plates 202A and 2023, respectively, have apertures 206A and 2063 to allow the interior air of the enclosure to pass through. Also shown are the bottom, top, and side walls 208, 210, and 212 and 214 of the inner chamber 228.

While some of the pieces of equipment 224 will largely fill the overall width "w" of the inner chamber 228 many other pieces of equipment 224 will allow a substantial gap to exist between themselves and the side walls 212 and 214 of the inner chamber. Similarly, gaps may exist between the individual pieces of equipment 224A and 224B and the shelf (or top wall 210) that is above it. It is also conceivable that gaps may exist between the equipment 224A and 224B and the shelves 219A and 2193 (or bottom wall 208) of the inner chamber 228. One or mote positions (e.g., a shelf 219) in the enclosure may be empty as illustrated in the bottommost position of the inner chamber 228 shown in FIG. 6A. Referring to FIG. 3A and recalling that the baffle 51 forms one wall of the mixing plenum 34, each of these gaps, if not blocked, will allow the internal cooling air of the inner chamber 228 to bypass the equipment 224. Thus, the baffle plates 202 are shown filling the gaps around each of the pieces of equipment 224 to prevent the cooling air from bypassing the equipment 224.

Preferably, the baffle plates 202 are made from one or more regularly sized rectangular segments. These segments can be made of any convenient material with metals, plastics and fabrics being preferred. FIG. 6B shows several exemplary baffle plates 202A, 202B, and 202C having been assembled from a collection of baffle segments 220, 222, 224, 226, 228, 230, and 232 as shown. Each of the segments 220, 222, 224, 226, 228, 230, and 232 includes one half of a hook and loop fastener on one side and the other half of the hook and loop fastener on the other side. Thus, the segments 220, 222, 224, 226, 228, 230, and 232 can be quickly assembled into one or more baffle plates 202 for any of the pieces of equipment 224 that might be mounted on a particular shelf 219. In particular, the resulting baffle plates 202 may extend from the sides of the shelves 219 a distance sufficient to reach and seal against the inner surfaces of the inner chamber side walls 212 and 214. The hook and loop fasteners on the segments 220, 222, 224, 226, 228, 230, and 232 provide a convenient attachment mechanism for attaching the baffle plates 202 to the shelves 219 (with hook and loop fasteners also on the edges of the shelves 219). Likewise, each of the baffle plates 202 may extend from the shelf 219 that it is attached to at least an adjacent shelf. If the baffle plate 202 is attached to the top shelf 219B, then the baffle plate 202 can be constructed in such a manner to extend to the top inside surface of the inner chamber 228. In this manner, the baffle plates 202 on the shelves 219 block the flow of air from a mixing plenum toward an exhaust plenum. The segments 220, 222, 224, 226, 228, 230, and 232 can be assembled into a baffle plate 202 with an aperture 206 sized, shaped, and positioned to align with the cooling air inlet 204 on a particular piece of equipment 224. Thus, with the baffle plates 202 fastened to the shelves 219, the overall baffle 251 directs the internal air from the mixing plenum into the cooling air inlets 204 of the pieces of equipment 224. In turn, the internal fans in the equipment 224 draw the internal air through the equipment 224 and expel the warmed exhaust air toward the exhaust plenum 236. Thus, if any of the pieces of equipment 224 use its internal fan as part of a temperature control loop (by, for instance, adjusting the speed of the internal fan in response to an internal temperature measurement) then the piece of equipment 224 can regulate its own supply of cooling air independently of the ECS system flow rate. Likewise, the piece of equipment 224 can regulate its internal temperature independently of the ECS flow rate.

In another preferred embodiment and with reference again to FIG. 3, the present invention provides a metal cabinet or enclosure 20 that provides environmental control for COTS equipment 24 (as well as other pieces of equipment 18) while alleviating the limitations of the previously available approaches. The enclosure 20 includes an outer shell that acts as a plenum 30 through which cooling air from the ECS system of an aircraft 10 circulates. A pair of ducts 60 and 64 from the ECS system attaches to the plenum 30 preferably on the top or the bottom of the enclosure 20. The enclosure 20 also includes an inner chamber 28 that is generally surrounded by the outer plenum 30. The inner chamber 28 holds COTS and other types of equipment 18 and 24. A wall 43 between the outer plenum 30 and the inner chamber 28 isolates the ECS air from the air in the inner chamber 28 and serves as a heat exchanger to cool the inner chamber 28 air. Otherwise the walls of the inner chamber 28 are hollow and form a pair of return plenums 32. Cool air enters the inner chamber 28 near the front side of the inner chamber 28 and flows through the equipment 24 thereby thermally conditioning the equipment 24. The warmed exhaust air exits the equipment 24 near the rear of the inner chamber 28 and then flows through the return plenums 32 back toward the front side of the inner chamber 28. Because one side of the hollow inner chamber wall is highly thermal conductive, the exhaust air exchanges heat with the ECS air via this thermally conductive wall and cools sufficiently to be recirculated through the equipment 24 once more.

Within the inner chamber 28 a series of shelves 19 support and restrain the equipment 24. The inside surfaces of the inner chamber 28 walls have numerous mounting holes, brackets, or other attachment means for the shelves 19. Thus, the shelves 19 are reconfigurable and can be placed in many different positions within the inner chamber 28 by selection of the mounting holes used to attach the shelves to the inner chamber 28.

Doors 46 and 47 are also provided on the front and back sides of the enclosure 20 for accessing the COTS equipment 24 in the inner chamber 28. Since the COTS equipment may be considered as LRUs (line replaceable units) the resulting front and back accessibility speeds maintenance on the aircraft. The doors 46 have seals associated with them so that when the doors 46 are closed the inner chamber 28 is hermetically sealed and isolated from the ECS air in the avionics bay 18 and from the ECS air in the outer plenum 30. Moreover, the enclosure 20 is made of preferably light weight material (e.g., aluminum) and is of sturdy rugged construction such that it can withstand a pressure difference of several psi between the internal and external pressures. Thus, if cabin pressure is "lost" the COTS equipment 24 in the inner chamber 28 is not affected.

In view of the foregoing, it will be seen that the several advantages of the invention are achieved and attained. The present invention provides a standardized, modular solution that allows COTS equipment to be easily integrated into aircraft or other vehicle environments, while allowing for typical military operations. Among other things, the present invention provides embodiments with an isolated, controlled environment for COTS equipment even on vehicles with the harshest service conditions. Since the COTS equipment is isolated in accordance with the principles of the present invention the need for air filters for the COTS equipment is eliminated.

The present invention also provides complete dial-in moisture and temperature control for COTS equipment. Additionally, because the ECS system is not relied on for distributing cooling air to the various pieces of equipment, no balancing of the ECS system is needed for individual pieces of equipment (or individual cabinets). Also, the present invention allows for simple reconfiguration of the cooling system (i.e., the baffle of the enclosure) to accommodate equipment changes. Moreover, the enclosures of the present invention can include native cooling capacity (i.e., a thermo-electric cold plate) that is independent of the ECS system. Since the thermo-electric cold plate uses electric power that can be supplied from the ground while the aircraft is stationary instead of relying on power from an auxiliary power unit the present invention also provides "green" air conditioning for the COTS equipment. For embodiments with more than one recirculation fan in the enclosures of the present invention, redundant cooling air flow is also provided to the COTS equipment. Moreover, the present invention allows significant COTS equipment operation even with the doors of the aircraft open (thereby limiting cooling capacity and exposing the avionics bay to potentially undesirable humidity levels.

The embodiments were chosen and described in order to best explain the principles of the invention and its practical application to thereby enable others skilled in the art to best utilize the invention in various embodiments and with various modifications as are suited to the particular use contemplated.

As various modifications could be made in the constructions and methods herein described and illustrated without departing from the scope of the invention, it is intended that all matter contained in the foregoing description or shown in the accompanying drawings shall be interpreted as illustrative rather than limiting. Thus, the breadth and scope of the present invention should not be limited by any of the exemplary embodiments, but should be defined in accordance with the claims and their equivalents.

What is claimed is:

1. An equipment enclosure for use in an environment wherein a thermal conditioning system supplies thermally conditioned air, the equipment enclosure comprising:
   a body having an inner chamber and an outer plenum, the inner chamber forming part of a circulation path through which a fluid is circulatable in a closed loop within the enclosure, the outer plenum forming part of a flow path for the conditioned air through the enclosure;
   an enclosure door and a baffle having one or more apertures therethrough, each aperture sized to match a corresponding inlet in a piece of equipment, the baffle configured to define a mixing plenum of the fluid circulation path upstream of the inner chamber and adjacent the door;
   a pair of return ducts forming parts of the fluid circulation path outside the inner chamber to carry the fluid from downstream of the inner chamber to the mixing plenum; and
   a thermally conductive wall of the return ducts configured to separate the fluid circulation path from the conditioned air flow path through the outer plenum while functioning as a heat exchanger between the fluid and the conditioned air.

2. The equipment enclosure of claim 1, the outer plenum comprising:
   a first portion providing for flow of the conditioned air in a first direction relative to the enclosure; and
   a second portion providing for flow of the conditioned air in a second direction relative to the enclosure, the second direction generally opposed to the first direction.

3. The equipment enclosure of claim 2, wherein the first portion of the outer plenum is configured to provide an upward flow path for the conditioned air, and the second portion of the outer plenum is configured to provide a downward flow path for the conditioned air.

4. The equipment enclosure of claim 2, wherein the first portion of the outer plenum is adjacent the second portion of the outer plenum.

5. The equipment enclosure of claim 1 further comprising an exhaust plenum downstream of the inner chamber, and at least one fan between the exhaust plenum and one of the return ducts.

6. The equipment enclosure of claim 1, one of the return ducts comprising a plurality of heat fins configured with the thermally conductive wall to conduct heat between the fluid and the conditioned air.

7. The equipment enclosure of claim 1, the body further configured to allow each of a plurality of pieces of equipment to regulate its own temperature and/or its own supply of the fluid independent of a flow rate of the conditioned air.

8. The equipment enclosure of claim 1, the baffle further comprising one or more baffle plates configurable to direct the fluid through the one or more apertures into the one or more corresponding inlets in equipment in the inner chamber while preventing substantially all flow of the fluid around the equipment other than into the one or more inlets.

9. The equipment enclosure of claim 1 further comprising a temperature controller adapted to sense the temperature of the fluid in the inner chamber and to adjust the flow of the conditioned air through the fluid port responsive to the temperature of the fluid.

10. The equipment enclosure of claim 9 further comprising a thermo-electric cold plate in the outer plenum, the temperature controller further adapted to operate the thermo-electric cold plate responsive to the temperature of the fluid whereby the temperature of the conditioned air can be adjusted.

11. The equipment enclosure of claim 1 further comprising a pair of valves in communication with the inner chamber and the thermal conditioning system to allow the conditioned air to circulate from the thermal conditioning system through the inner chamber and return to the thermal conditioning system.

12. The equipment enclosure of claim 1 further comprising a water vapor source in communication with the inner chamber whereby the humidity in the inner chamber can be adjusted.

13. The equipment enclosure of claim 1 wherein the fluid circulation path is bifurcated through the return ducts, and the conditioned air flow path is bifurcated through the outer plenum.

14. A method of thermally conditioning equipment in an environment where a thermal conditioning system supplies thermally conditioned air, the method comprising:
   enclosing one or more pieces of equipment in an inner chamber of an enclosure, the enclosure having a flow path for the conditioned air and a circulation path for a fluid, the fluid circulation path including the inner chamber, a pair of return ducts downstream of the inner chamber, and a mixing plenum downstream of the return ducts, the mixing plenum formed between a door of the enclosure and a substantially vertical baffle directing substantially horizontal entry of the fluid through one or more apertures of the baffle into one or more inlets in the equipment in the inner chamber, the one or more apertures aligned with the one or more inlets, the conditioned air flow path including an outer plenum of the enclosure, the outer plenum adjacent to the return ducts;
   circulating the fluid in a closed loop through the mixing plenum, inner chamber and return ducts to exchange heat between the equipment and the fluid; and
   substantially vertically circulating the conditioned air upwardly through a first portion of the outer plenum and downwardly through a second portion of the outer plenum and past a thermally conductive wall of the return ducts to exchange heat through the wall between the fluid and the conditioned air in the outer plenum.

15. The method of claim 14 further comprising humidifying the fluid, the humidifying performed using a water vapor source in communication with the inner chamber.

16. The method of claim 14 further comprising moving the fluid from an exhaust plenum downstream of the inner chamber to the return ducts, the moving performed using at least one fan downstream of the exhaust plenum.

17. The method of claim 14 further comprising circulating the fluid through a plurality of heat fins of the return ducts to exchange heat between the fluid and the conditioned air.

18. The method of claim 14 further comprising arranging a plurality of plates of the baffle to direct the fluid from the mixing plenum into an inlet in a piece of equipment in the inner chamber and to prevent substantially all flow of the fluid around the piece of equipment other than into the inlet.

19. The method of claim 14 further comprising circulating the fluid in the inner chamber through the equipment.

20. The method of claim 19 further comprising mixing the fluid to an isothermal state in the mixing plenum before circulating the fluid through the equipment.

21. The method of claim 14 wherein the inner chamber is generally surrounded on at least two sides by the outer plenum, the method further comprising directing the fluid in the fluid circulation path around the sides of the inner chamber to exchange heat with the conditioned air in the outer plenum.

22. The method of claim 14 further comprising allowing each of the one or more pieces of equipment to regulate temperature and/or flow of the fluid through itself independent of a flow rate of the conditioned air.

23. An equipment enclosure for use in an environment wherein a thermal conditioning system supplies thermally conditioned air, the equipment enclosure comprising:
- a body having an inner chamber and an outer plenum at least partially surrounding the inner chamber, the chamber forming part of a circulation path through which a fluid is circulatable in a closed loop within the enclosure, the outer plenum forming part of a flow path for the conditioned air through the enclosure;
- a front door of the enclosure and a baffle facing the door at a front of the inner chamber, the door and baffle defining a mixing plenum of the fluid circulation path upstream of the inner chamber, the baffle having one or more apertures configured to direct the fluid from the mixing plenum into one or more corresponding equipment inlets while the baffle restricts the fluid from flowing elsewhere in the inner chamber;
- an exhaust plenum in the body rearward of the inner chamber;
- one or more fans configured to circulate the fluid from the exhaust plenum to the mixing plenum;
- one or more return ducts in the fluid circulation path outside the inner chamber to carry the fluid circulated through the exhaust plenum to the mixing plenum; and
- a thermally conductive wall of the one or more return ducts that separates the fluid circulation path from the conditioned air flow path through the outer plenum while functioning as a heat exchanger between the fluid and the conditioned air.

* * * * *